US010749028B2

(12) United States Patent
Mehrotra et al.

(10) Patent No.: US 10,749,028 B2
(45) Date of Patent: Aug. 18, 2020

(54) TRANSISTOR WITH GATE/FIELD PLATE STRUCTURE

(71) Applicant: NXP USA, INC., Austin, TX (US)

(72) Inventors: Saumitra Raj Mehrotra, Scottsdale, AZ (US); Bernhard Grote, Phoenix, AZ (US); Ljubo Radic, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 63 days.

(21) Appl. No.: 16/205,461

(22) Filed: Nov. 30, 2018

(65) Prior Publication Data

US 2020/0176599 A1   Jun. 4, 2020

(51) Int. Cl.
*H01L 29/78* (2006.01)
*H01L 29/40* (2006.01)
(Continued)

(52) U.S. Cl.
CPC ...... *H01L 29/7825* (2013.01); *H01L 29/0649* (2013.01); *H01L 29/407* (2013.01); *H01L 29/66704* (2013.01)

(58) Field of Classification Search
CPC ........... H01L 29/4236; H01L 21/28105; H01L 21/823481; H01L 29/1095; H01L 29/402; H01L 29/456; H01L 29/66696; H01L 29/78; H01L 29/7802; H01L 29/7827; H01L 29/0649; H01L 29/0847; H01L 29/4175; H01L 29/42376; H01L 29/66621; H01L 29/66659; H01L 29/7834; H01L 21/82385; H01L 21/823857; H01L 29/41758; H01L 29/4232; H01L 29/513; H01L 29/518; H01L 29/66681;
(Continued)

(56) References Cited

U.S. PATENT DOCUMENTS 4,553,151 A   11/1985   Schutten et al.
4,893,160 A   1/1990   Blanchard
(Continued)

FOREIGN PATENT DOCUMENTS

WO   2005093841 A2   10/2005

OTHER PUBLICATIONS

Final office action dated Jun. 7, 2019 in U.S. Appl. No. 15/715,816.
(Continued)

*Primary Examiner* — Mark W Tornow
*Assistant Examiner* — Priya M Rampersaud
(74) *Attorney, Agent, or Firm* — David G. Dolezal

(57) ABSTRACT

Disclosed herein is a conductive structure that serves as both a control terminal and a field plate for a transistor. The transistor includes a channel region including a portion located in a vertical sidewall of semiconductor material that separates an upper level portion and a lower level portion of the semiconductor material. An extended drain region includes a portion located in the lower portion of the semiconductor material. The conductive structure is laterally adjacent to the vertical sidewall and includes a first vertical side and an opposite second vertical side with the first vertical side being closer to the vertical component sidewall. The first side is vertically closer to the lower level portion of the semiconductor material than the second vertical side.

17 Claims, 12 Drawing Sheets

(51) Int. Cl.
   *H01L 29/06* (2006.01)
   *H01L 29/66* (2006.01)
(58) Field of Classification Search
   CPC .......... H01L 29/66689; H01L 29/7809; H01L 29/7813; H01L 29/7816; H01L 29/7824; H01L 29/66704; H01L 29/7825; H01L 21/28176; H01L 21/823425; H01L 21/823487; H01L 27/088; H01L 29/0882; H01L 29/407; H01L 29/41741; H01L 29/6656; H01L 29/66719; H01L 29/66734
   See application file for complete search history.

(56) References Cited

U.S. PATENT DOCUMENTS

| | | |
|---|---|---|
| 5,316,959 A | 5/1994 | Kwan et al. |
| 5,324,683 A | 6/1994 | Fitch et al. |
| 5,407,860 A | 4/1995 | Stoltz et al. |
| 5,434,435 A | 7/1995 | Baliga |
| 5,723,891 A * | 3/1998 | Malhi ............... H01L 29/42368 257/330 |
| 5,736,446 A | 4/1998 | Wu et al. |
| 5,770,507 A | 6/1998 | Chen et al. |
| 5,869,379 A | 2/1999 | Gardner et al. |
| 5,914,519 A | 6/1999 | Chou et al. |
| 6,064,107 A | 5/2000 | Yeh et al. |
| 6,277,700 B1 | 8/2001 | Yu et al. |
| 6,858,500 B2 | 2/2005 | Sugi |
| 6,861,332 B2 | 3/2005 | Park et al. |
| 6,864,135 B2 | 3/2005 | Grudowski et al. |
| 6,946,348 B2 | 9/2005 | Zeng |
| 7,368,785 B2 | 5/2008 | Chen et al. |
| 7,400,024 B2 | 7/2008 | Kunnen |
| 7,576,388 B1 | 8/2009 | Wilson et al. |
| 7,709,889 B2 | 5/2010 | Moens et al. |
| 7,759,206 B2 | 7/2010 | Luo et al. |
| 7,800,167 B2 | 9/2010 | Kitamura et al. |
| 7,893,488 B2 | 2/2011 | Hebert |
| 7,923,776 B2 | 4/2011 | Yilmaz et al. |
| 8,043,913 B2 | 10/2011 | Yilmaz et al. |
| 8,304,312 B2 | 11/2012 | Hebert |
| 8,319,278 B1 | 11/2012 | Zeng et al. |
| 8,329,538 B2 | 12/2012 | Pan et al. |
| 8,502,287 B2 | 8/2013 | Radic et al. |
| 8,647,950 B2 | 2/2014 | Zuniga et al. |
| 8,716,794 B2 | 5/2014 | Luo et al. |
| 8,742,495 B2 | 6/2014 | Parthasarathy et al. |
| 8,981,470 B2 | 3/2015 | Nozu |
| 9,171,931 B2 | 10/2015 | Ng et al. |
| 9,559,198 B2 | 1/2017 | Stefanov et al. |
| 9,620,583 B2 | 4/2017 | Kelkar et al. |
| 10,103,257 B1 | 10/2018 | Qin et al. |
| 2004/0021233 A1 | 2/2004 | Kinzer et al. |
| 2004/0022123 A1 | 2/2004 | Kinzer et al. |
| 2006/0001084 A1 | 1/2006 | Kelly et al. |
| 2006/0017078 A1 | 1/2006 | Thapar |
| 2006/0209586 A1 | 9/2006 | Hirler |
| 2009/0256212 A1 | 10/2009 | Denison et al. |
| 2010/0006929 A1 | 1/2010 | Andou |
| 2010/0015770 A1 | 1/2010 | Tai et al. |
| 2010/0244125 A1 | 9/2010 | Sonsky et al. |
| 2013/0105888 A1* | 5/2013 | Zuniga ............... H01L 29/66704 257/330 |
| 2013/0181723 A1 | 7/2013 | Mauder et al. |
| 2013/0334565 A1 | 12/2013 | Hutzler et al. |
| 2014/0021534 A1* | 1/2014 | Verma ............... H01L 29/66704 257/330 |
| 2014/0097492 A1 | 4/2014 | Yu |
| 2014/0138739 A1 | 5/2014 | Magri et al. |
| 2014/0225186 A1 | 8/2014 | Abou-Khalil et al. |
| 2015/0084123 A1* | 3/2015 | Kawashiri ........... H01L 29/7811 257/330 |
| 2015/0137223 A1 | 5/2015 | Siemieniec et al. |
| 2015/0380348 A1 | 12/2015 | Noebauer et al. |
| 2015/0380538 A1 | 12/2015 | Ogawa |
| 2016/0020315 A1 | 1/2016 | Hirler |
| 2016/0211348 A1 | 7/2016 | Yoshida |
| 2016/0359029 A1 | 12/2016 | Zeng et al. |
| 2017/0263767 A1 | 9/2017 | Nishiwaki |
| 2017/0338337 A1 | 11/2017 | Bobde et al. |
| 2018/0006026 A1 | 1/2018 | Lui |
| 2018/0006109 A1 | 1/2018 | Mauder et al. |
| 2018/0090490 A1 | 3/2018 | Lin et al. |
| 2019/0097046 A1 | 3/2019 | Mehrotra et al. |
| 2019/0206987 A1 | 7/2019 | Adachi et al. |

OTHER PUBLICATIONS

Notice of Allowance dated Jul. 9, 2019 in U.S. Appl. No. 15/715,852.
Final office action dated Jul. 18, 2019 in U.S. Appl. No. 15/715,831.
Non-final office action dated Feb. 21, 2019 in U.S. Appl. No. 15/715,816.
Ex-Parte Quayle action dated Mar. 5, 2019 in U.S. Appl. No. 15/715,852.
Non-final office action dated Apr. 9, 2019 in U.S. Appl. No. 15/715,831.
Ex-Parte Quayle action dated Apr. 25, 2019 in U.S. Appl. No. 15/715,852.
Notice of Allowance dated Feb. 4, 2020 in U.S. Appl. No. 15/918,563.
U.S. Appl. No. 16/836,293, filed Mar. 31, 2020, entitled Transistor Trench With Field Plate Structure.
U.S. Appl. No. 16/836,344, filed Mar. 31, 2020, entitled Trench With Different Transverse Cross-Sectional Widths.
Notice of Allowance dated Apr. 21, 2020 in U.S. Appl. No. 16/174,955.
Non-final office action dated May 4, 2020 in U.S. Appl. No. 16/171,830.
Qiao, M., "A Novel Substrate-Assisted RESURF Technology for Small Curvature Radius Junction", Proceedings of the 23rd International Symposium on Power Semiconductor Devices & IC's, May 23-26, 2011.
Notice of Allowance dated Sep. 25, 2019 in U.S. Appl. No. 15/715,831.
Final office action dated Nov. 19, 2019 in U.S. Appl. No. 15/715,816.
Non-final office action dated Jul. 25, 2019 in U.S. Appl. No. 15/918,563.
Cha, H., "0.18um 100V-rated BCD with Large Area Power LDMOS with ultra-low effective Specific Resistance", IEEE 2016.
Cheng, K., "Air Spacer for 10nm FinFET CMOS and Beyond", IEEE 2016.
Chil, M., "Advanced 300mm 130NM BCD technology from 5V to 85V with Deep-Trench Isolation", IEEE 2016.
Fujishima, D.H., "Integrated Bi-directional Trench Lateral Power MOSFETs for One Chip Lithium-ion Battery Protection ICs", Proceedings of the 17 International Symposium on Power Semiconductor Devices & IC's, Santa Barbara, CA, May 23-26, 2005.
Huang, T., "0.18um BCD Technology with Best-in-Class LDMOS from 6 V to 45 V", Proceedings of the 26th International Symposium on Power Semiconductor Devices & IC's, Jun. 15-19, 2014.
Kumar, M., "Extended-p+ Stepped Gate LDMOS for improved Performance", IEEE Transactions on Electron Devices, vol. 57, No. 7, Jul. 2010.
Lu, D.H., "Integrated Bi-directional Trench Lateral Power MOSFETs for One Chip Lithium-ion Battery Protection ICs", Proceedings of the 17th International Symposium on Power Semiconductor Devices & IC's, May 23-26, 2005.
Takaya, H., "Floating Island and Thick Bottom Oxide Trench Gate MOSFET (FITMOS)—A 60V Ultra Low On-Resistance Novel MOSFET with Superior Internal Body Diode-", Proceedings of the 17th International Symposium on Power Semiconductor Devices & IC's, May 23-26, 2005.
Yang, H., "Low-Leakage SMARTMOS IOW Technology at 0.13um Node with Optimized Analog, Power and Logic Devices for SOC Design", IEEE 2008.
Yang, H., "Approach to the Silicon Limit: Advanced NLDMOS in 0.13 um SOI Technology for Automotive and Industrial Applica-

(56) References Cited

OTHER PUBLICATIONS tions up to 110V", Proceedings of the 25th International Symposium on Power Semiconductor Devices & ICs, Kanazawa, 2013.
Zhigang, W., "Analysis of OFF-state and ON-state performance in a silicon-on-insulator power MOSFET with a low-k dielectric trench", Chinese Institute of Electronics, Journal of Semiconductors, vol. 34, No. 7, Jul. 2013.
U.S. Appl. No. 15/715,816, filed Sep. 26, 2017, entitled "Field-Effect Transistor and Method Therefor".
U.S. Appl. No. 15/715,831, filed Sep. 26, 2017, entitled "Field-Effect Transistor and Method Therefor".
U.S. Appl. No. 15/715,852, filed Sep. 26, 2017, entitled "Field-Effect Transistor and Method Therefor".
U.S. Appl. No. 15/918,563, filed Mar. 12, 2018, entitled "Transistor Trench Structure With Field Plate Structures".
U.S. Appl. No. 16/141,674, filed Sep. 25, 2018, entitled "Transistor Devices With Control-Terminal Field Plate Structures in Trenches".
U.S. Appl. No. 16/171,830, filed Oct. 26, 2018, entitled "Transistor Devices With Extended Drain Regions Located in Trench Sidewalls".
U.S. Appl. No. 16/174955, filed Oct. 30, 2018, entitled "Vertical Transistor With Extended Drain Region".
Non-final office action dated Oct. 15, 2018 in U.S. Appl. No. 15/715,816.
Non-final office action dated Nov. 16, 2018 in U.S. Appl. No. 15/715,852.
U.S. Appl. No. 16/692,517, filed Nov. 22, 2019, entitled "Transistor Formed With Spacer".
U.S. Appl. No. 16/715,396, filed Dec. 16, 2019, entitled "Transistor With Extended Drain Region".
Ex-Parte Quayle dated Jan. 7, 2020 in U.S. Appl. No. 16/174,955.
Notice of Allowance dated Jan. 21, 2020 in U.S. Appl. No. 15/715,816.
Non-final office action dated Aug. 8, 2019 in U.S. Appl. No. 15/715,816.

\* cited by examiner

US 10,749,028 B2

TRANSISTOR WITH GATE/FIELD PLATE STRUCTURE

BACKGROUND OF THE INVENTION

Field of the Invention

This invention relates in general to transistor devices and more specifically to transistor devices with conductive structures that serves as control terminals and field plates.

Background

Some types of transistors such as power transistors, high voltage devices, and RF devices (e.g. laterally diffused metal oxide semiconductor (LDMOS), drain extended MOS (DEMOS)) include extended drain regions located in a carrier path between the drain region and the channel region. An extended drain region of a transistor has the same net conductivity type as the drain region of the transistor. An extended drain region may provide a transistor with a higher breakdown voltage in that most of the voltage applied to the drain region is dropped across the drift region of the extended drain region.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein is a conductive structure that serves as both a control terminal and a field plate for a transistor. The transistor includes a channel region including a portion located in a vertical sidewall of semiconductor material that separates an upper level portion and a lower level portion of the semiconductor material. An extended drain region includes a portion located in the lower portion of the semiconductor material. The conductive structure is laterally adjacent to the vertical sidewall and includes a first vertical side and an opposite second vertical side with the first vertical side being closer to the vertical component sidewall. The first side is vertically closer to the lower level portion of the semiconductor material than the second vertical side. In some embodiments, the difference in vertical distances of the vertical sides of the conductive structure can be formed by etching selective dielectric materials in a trench wherein one of the layers is used to protect a portion of the other layer during etching. The conductive structure can then be formed in the trench.

One advantage of such a transistor device is that the transistor occupies less area of a die in that the channel region is vertical and yet the device is scalable in that a significant portion of the extended drain region is horizontally oriented to allow for varying the length of the extended drain region to adjust the desired breakdown voltage. Also, because a single structure is used for both the control terminal and the field plate, the manufacturing of the device can be simplified. In addition, the thickness of the control terminal gate dielectric and field plate dielectric can be independently set to optimized for desired transistor characteristics.

FIGS. 1-8 set forth partial cutaway side views of various stages of a wafer in the manufacture of a transistor device according to one embodiment of the present invention.

Figure 1:
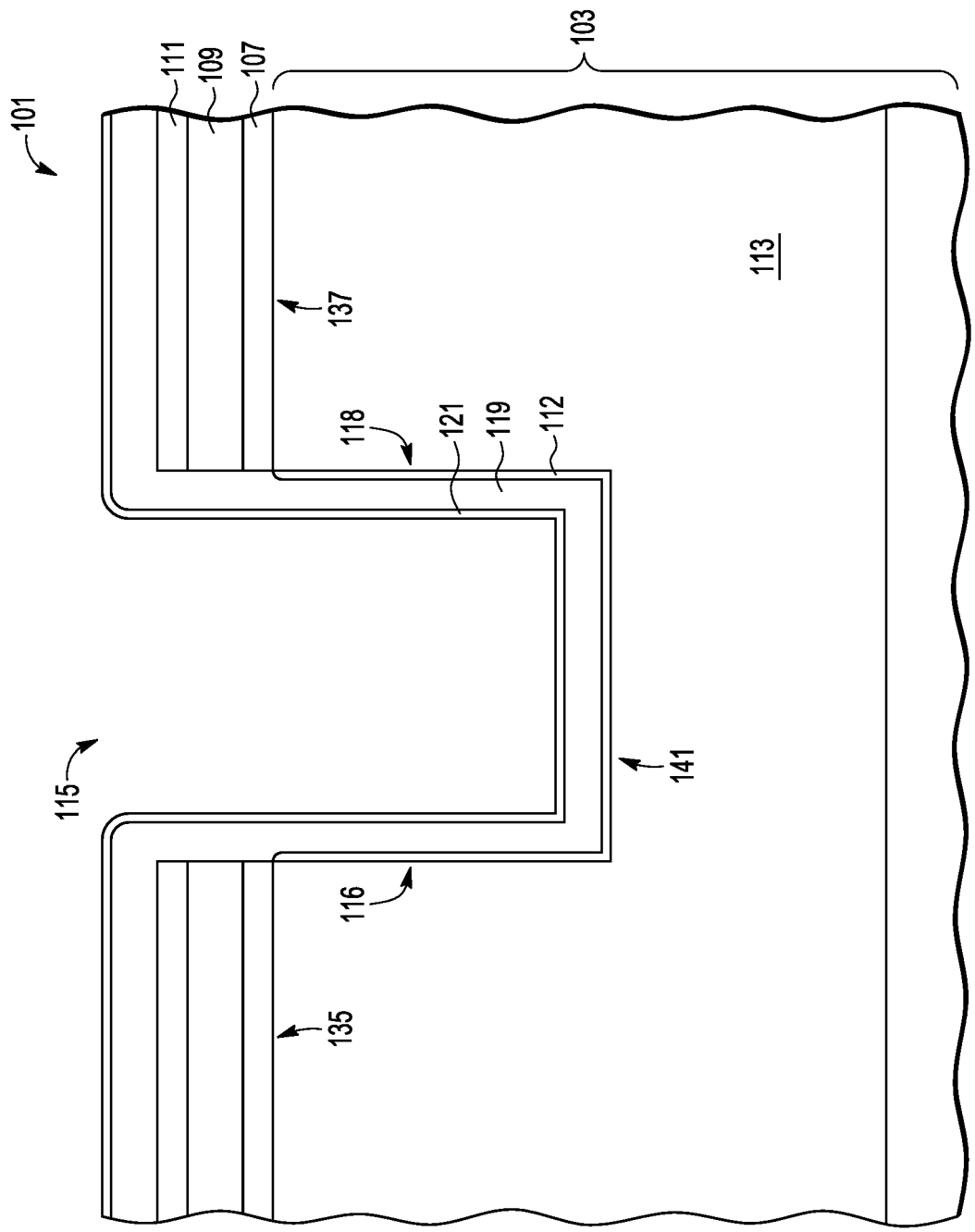
FIGS. 1-8 set forth partial cutaway side views of various stages in the manufacture of a transistor device according to one embodiment of the present invention.

FIG. 1 is a partial cutaway side view showing a portion of wafer 101 with a trench 115 formed therein. In one embodiment, wafer 101 includes a substrate 103 of semiconductor material. In one embodiment, substrate 103 has a net P-type conductivity doping. In one embodiment, substrate 103 is doped with boron and has a net P-type conductivity dopant concentration of about $2e15/cm^3$, but may be doped with other types of dopants and/or may be at other concentrations in other embodiments. In one embodiment, substrate 103 is made of monocrystalline silicon, but may be made of other semiconductor materials (e.g. silicon germanium, germanium, silicon carbide, gallium nitride, gallium arsenide, other semiconductor III-V materials) in other embodiments. In yet another embodiment, substrate 103 may be a semiconductor-on-insulator (SOI) substrate where the trenches are formed in the semiconductor layer located above the insulator layer (not shown). In other embodiments, substrate 103 may be made of layers of different semiconductor material and/or include other regions (not shown) of different conductivity types (e.g. a buried N-type region).

Substrate 103 includes a region 113 implanted with N-type dopants. In one embodiment, region 113 is implanted with phosphorous dopants at an energy of 100-1000 keV and at a dosage of $1e^{11}$-$1e^{13}/cm^2$, but may be implanted with other types of dopants, at other energies, and at other dosages in other embodiments. In one embodiment, region 113 can be part of an N-type epi growth region with a doping concentration of $1e^{16}$-$1e^{18}/cm^3$. In one embodiment, after implantation, wafer 101 is annealed where the dopants diffuse to the location of region 113 shown in FIG. 1. After diffusion, the dopants have a desired concentration for extended drain regions for subsequently formed transistors.

After the implantation of the N-type dopants, a pad oxide layer 107, nitride layer 109, and oxide layer 111 are formed on substrate 103. Afterwards, a trench 115 is formed in wafer 101. The formation of trench 115 forms vertical sidewalls 116 and 118 in substrate 103 as well as upper level surface levels 135 and 137 and lower surface level 141. In one embodiment, trench 115 is formed by forming a patterned mask (not shown) on wafer 101 and then anisotropically etching layers 111, 109, 107, and substrate 103 as per the pattern with the appropriate etch chemistries. In other embodiments, other types of hard mask layers may be utilized in forming trench 115. In one embodiment, trench 115 has a width of 1.0 µm and a depth of 0.4 µm, but may have other widths and/or depths in other embodiments.

After the formation of trench 115, an oxide layer 117 is formed on the sidewalls and bottom of trench 115. In one embodiment, layer 117 has a thickness of 100 Å and is formed by an oxidation process, but may be of other thicknesses, of other dielectric materials, and/or formed by other methods in other embodiments.

After the formation of layer 117, a layer 119 of oxide is deposited over wafer 101 including in trench 115 along the vertical sidewalls 116 and 118 and along the bottom portion over lower surface level 141. In one embodiment, layer 119 has a thickness of 50 nm, but may have other thicknesses in other embodiments. In one embodiment, layer 119 may be formed by a Tetraethyl orthosilicate (TEOS) deposition process, but maybe formed by other deposition processes in other embodiments. In some embodiments, layer 117 would be formed to the thickness of layer 119, and layer 119 would be omitted. In one embodiment, the thickness of layers 117 and 119 is of an optimum value for a field plate dielectric for a field plate portion of a subsequently formed conductive structure 603 (see FIG. 6).

Afterwards, a layer 121 of nitride is formed over wafer 101. Layer 121 is formed by a deposition process and has a thickness of 10 nm, but may be formed by other processes and have other thicknesses in other embodiments.

Figure 2:
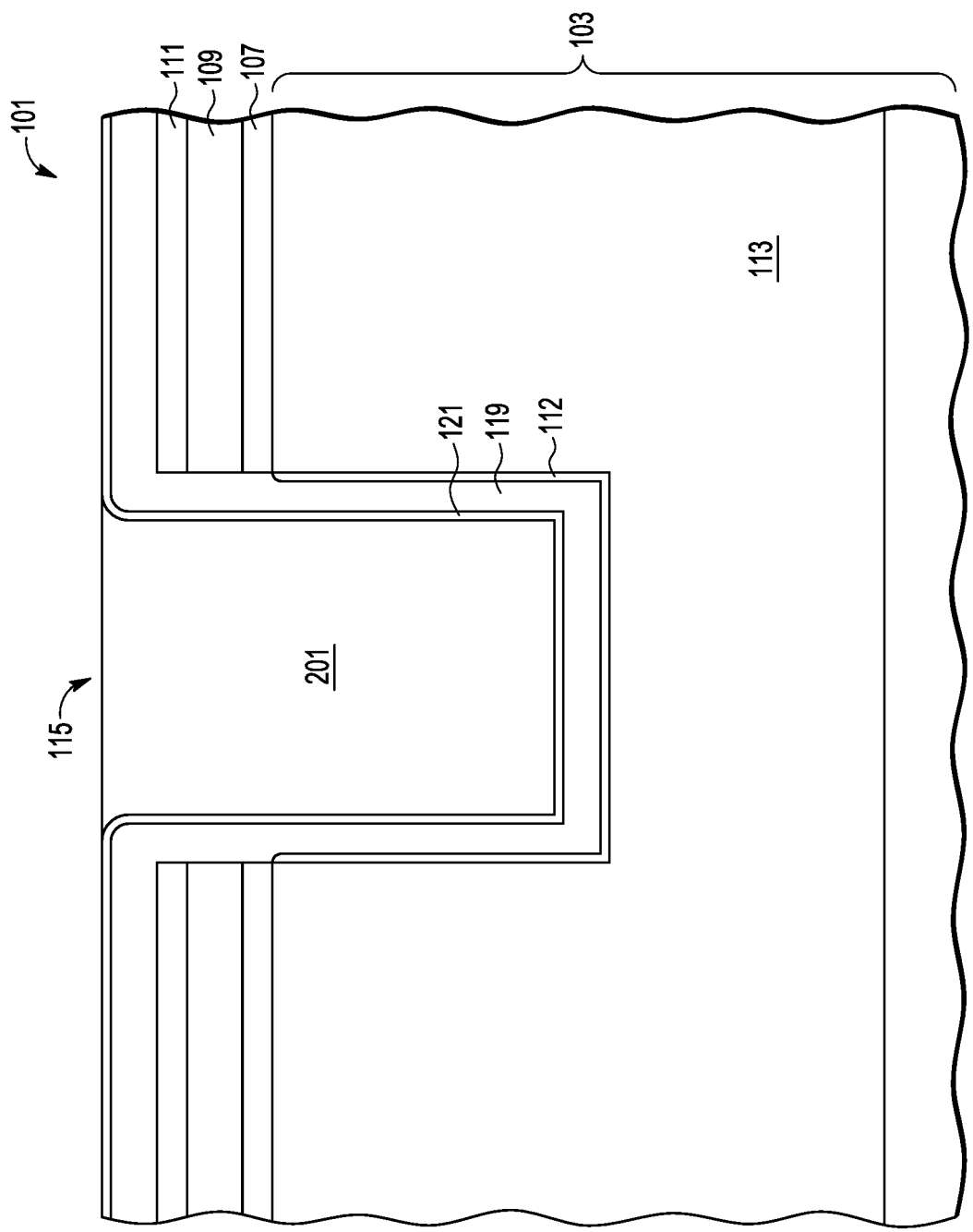

FIG. 2 is partial cutaway side view of wafer 101 after a dielectric structure 201 is formed in trench 115. In one embodiment, structure 201 is made of an oxide and is formed by forming a layer of oxide over wafer 101 and then planarizing to nitride layer 121. The layer of oxide has a thickness sufficient to fill trench 115 to a level above layer 121.

Figure 3:
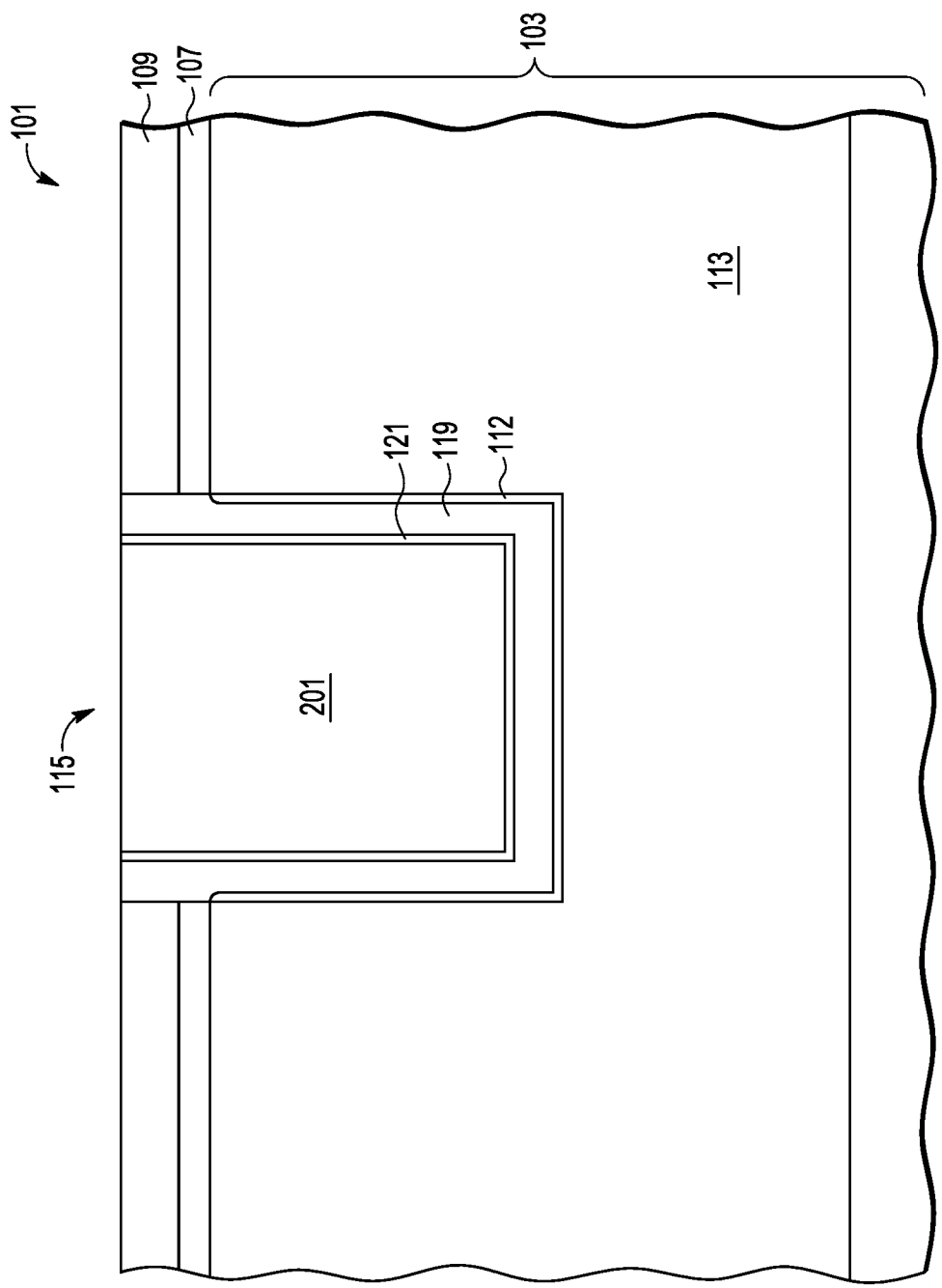

FIG. 3 is a partial cutaway side view of wafer 101 after nitride layer 121 is etched with an appropriate etch chemistry (e.g. plasma etching in $SF_6/CH_4/N_2/O_2$) to expose oxide layer 119. Afterwards, wafer 101 is etched down to nitride layer 109.

Figure 4:
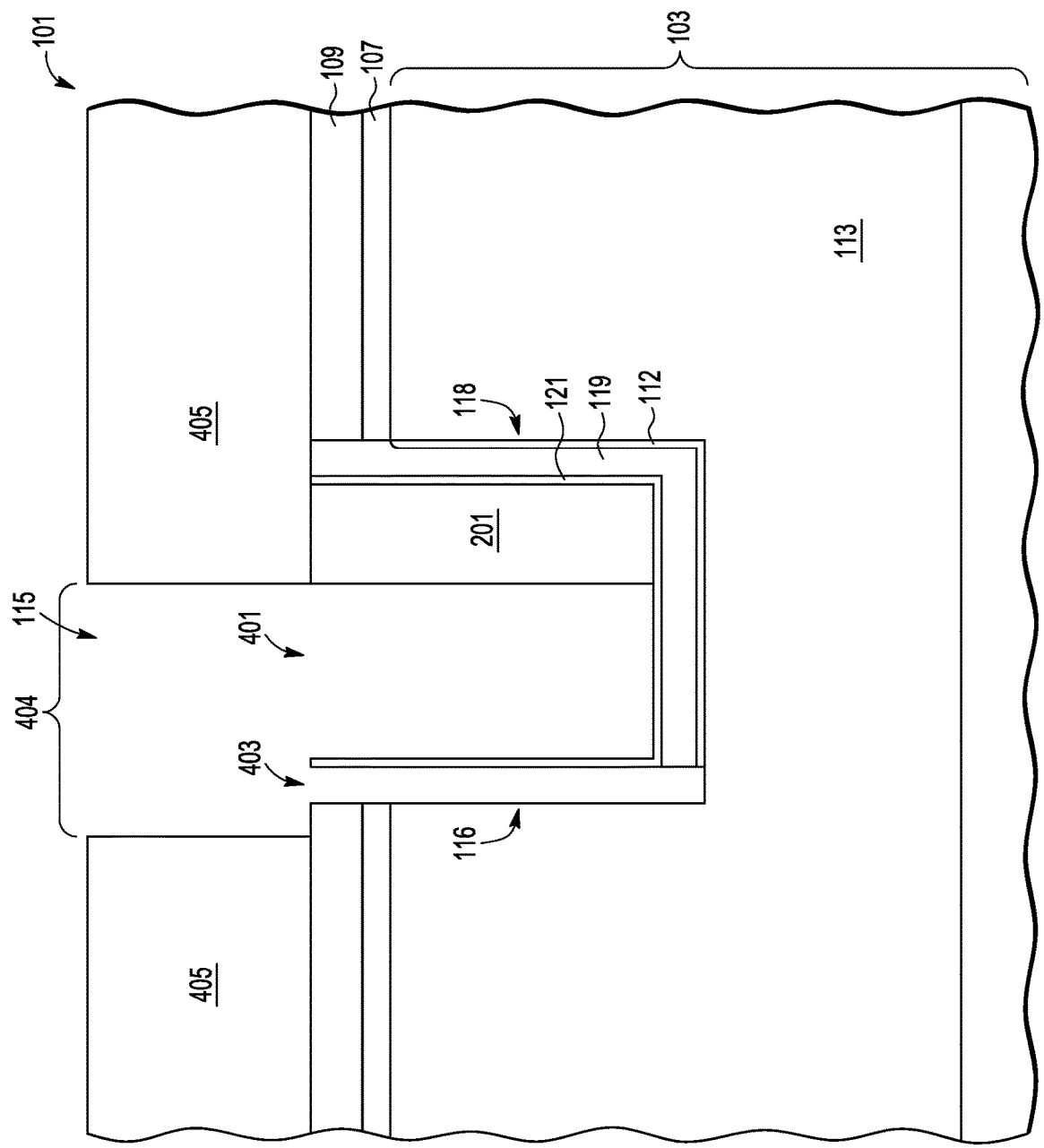

FIG. 4 is a partial cutaway side view of wafer 101 after a mask 405 is formed over wafer 101 with a patterned opening 404. Afterwards wafer 101 is subjected to an anisotropic oxide etch (e.g. plasma etching in $Ar/CH F_3$) to remove the exposed oxide of layers 117 and 119 and structure 201. Nitride layer 121 protects portions of layers 119 and 117 in trench 115 from being etched during the oxide etch. In one embodiment, the width of the remaining portion of oxide structure 201 in trench 115 after the oxide etch is dependent upon a desired distance of the conductive structure 603 from sidewall 118 to provide desired breakdown characteristics. In some embodiments, the vertical portion of layer 121 may be removed during the oxide etch depending on the selectivity ratio of the anisotropic oxide etch.

Figure 5:
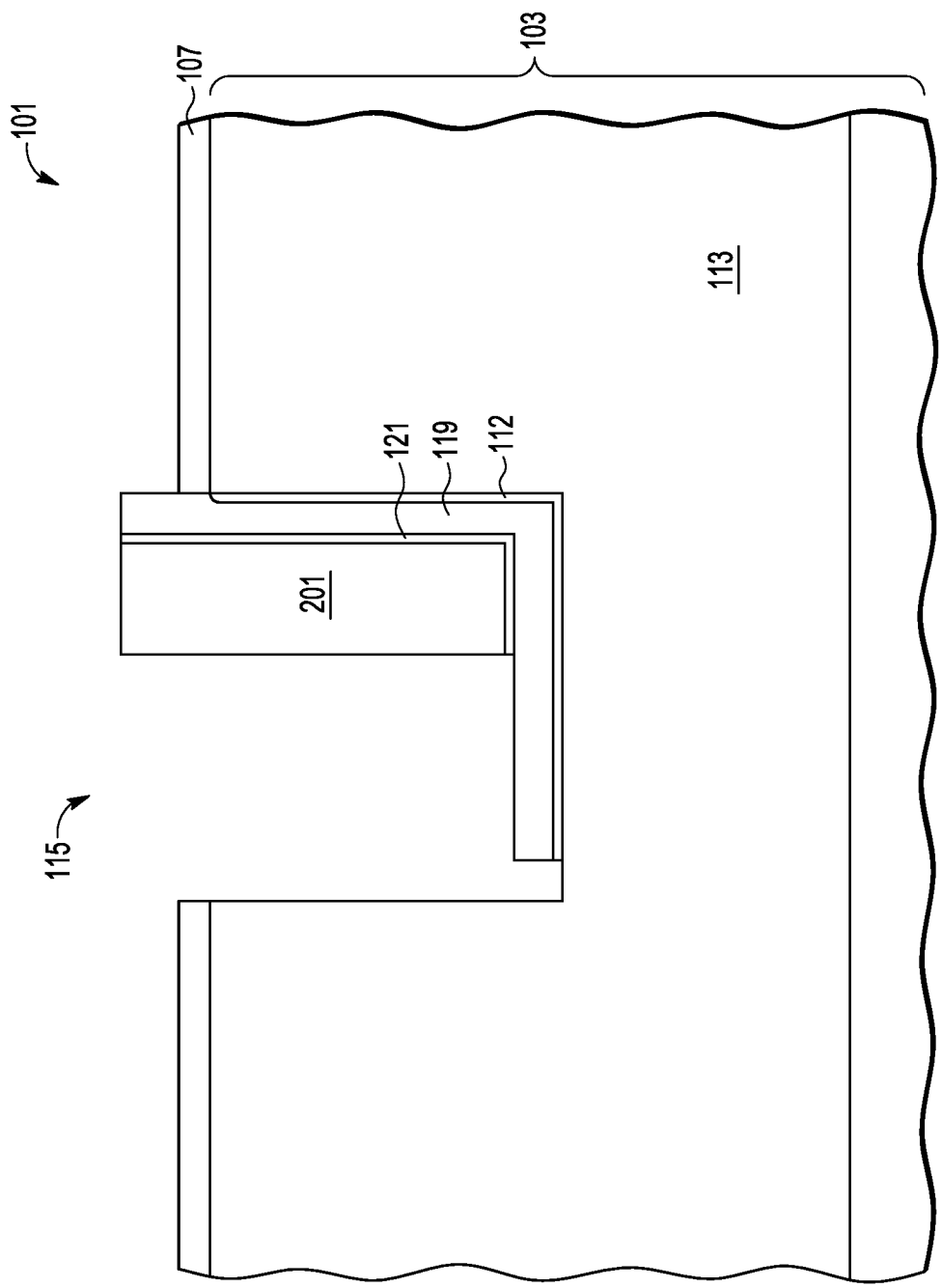

FIG. 5 is a partial cutaway side view of wafer 101 after mask 405 is removed and nitride layer 109 and the exposed portion of nitride layer 121 are removed with an anisotropic etch (plasma etching in $CF_4/H_2$).

Figure 6:
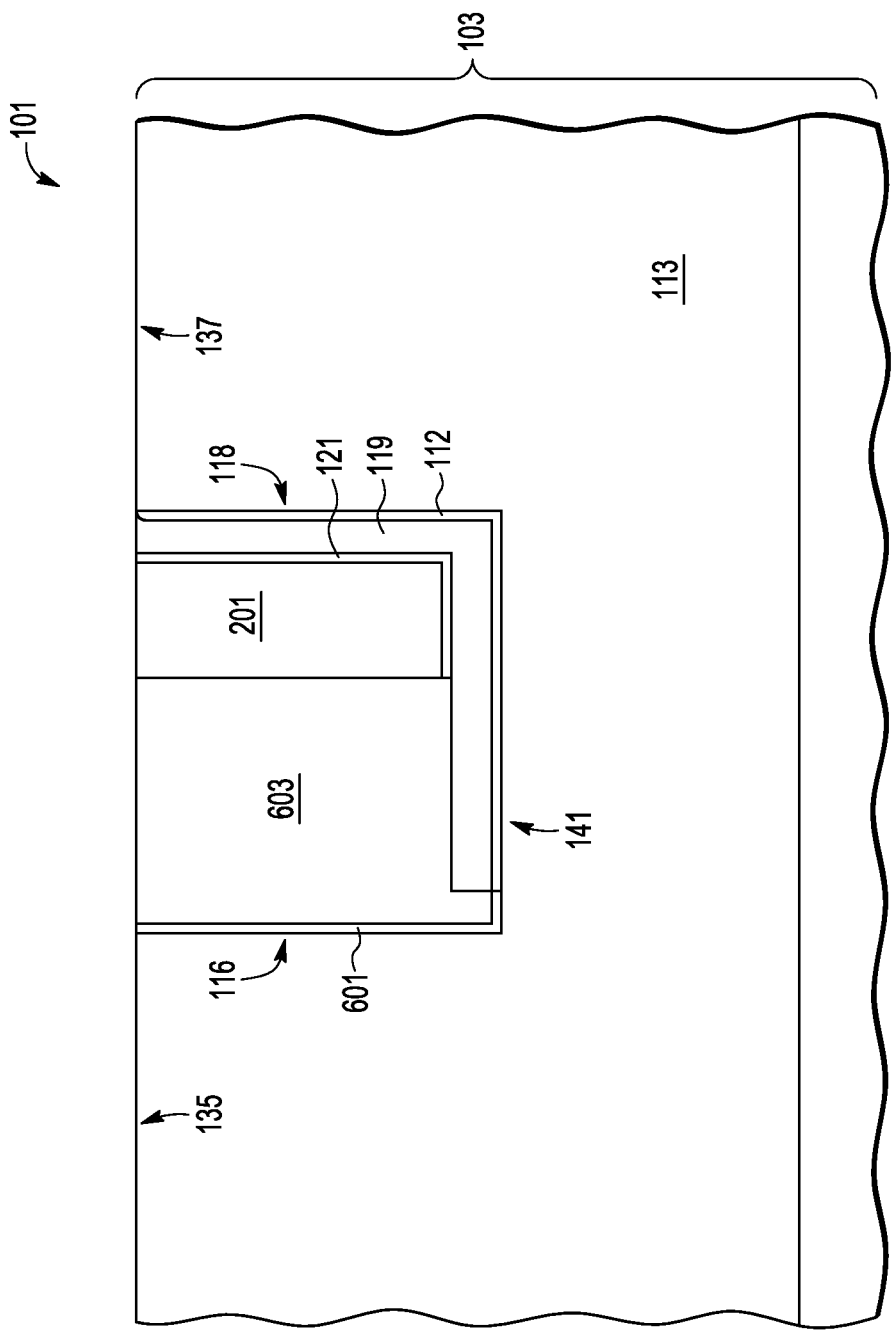

FIG. 6 is a partial cutaway side view of wafer 101 after a gate dielectric layer 601 is formed on the exposed semiconductor surfaces of sidewall 116 and exposed surface of lower surface level 141. In one embodiment, layer 601 is formed by an oxidation process and has a thickness of 150 (Å) Angstroms, but may be formed of other dielectric materials, be formed by other processes, and/or be of other thicknesses in other embodiments.

Afterwards, a conductive material (e.g. polysilicon, a metal) is deposited over wafer 101 including in unoccupied portions of trench 115 to fill trench 115. Wafer 101 is then planarized to substrate 103 in the embodiment shown to form conductive structure 603.

Figure 7:
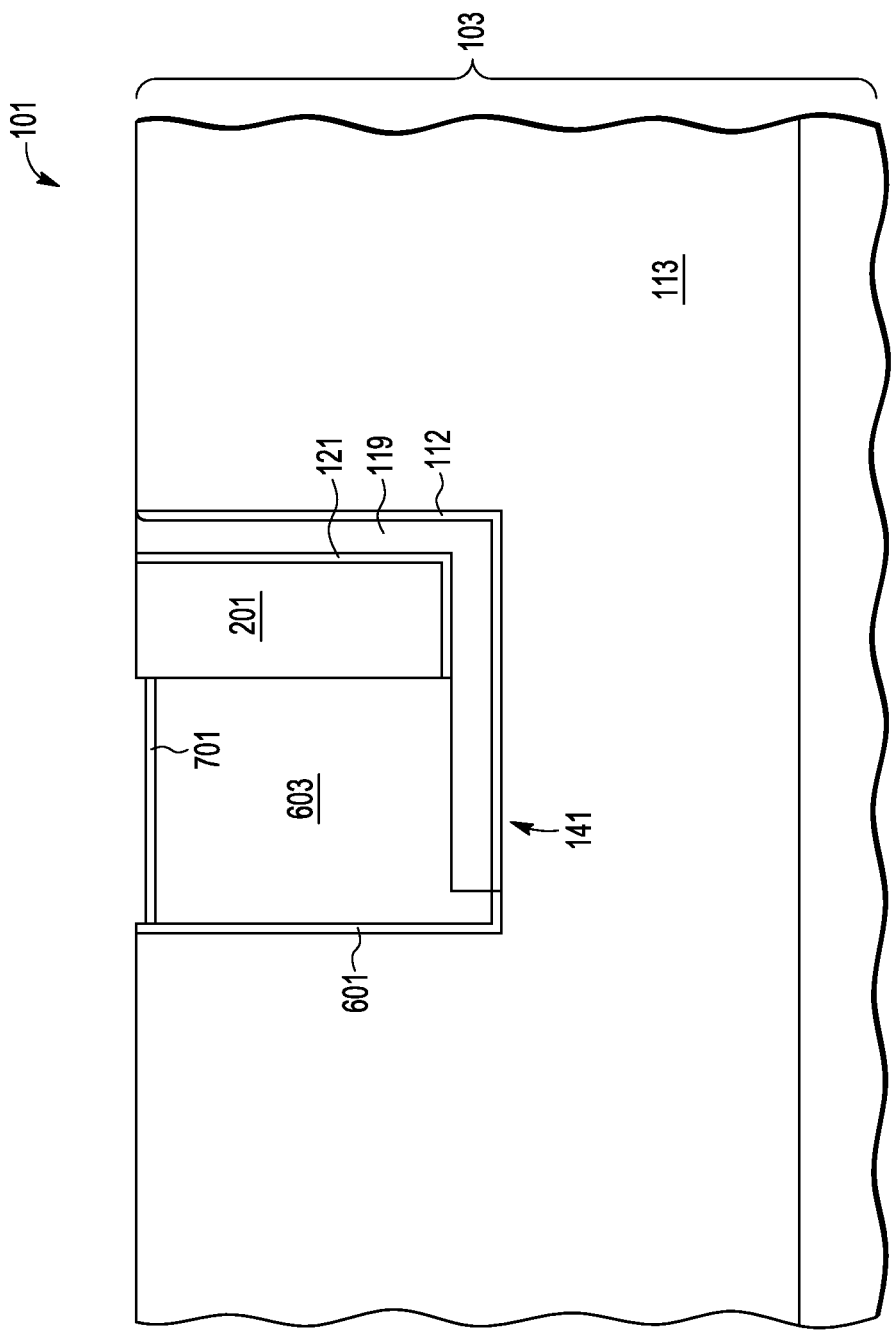

FIG. 7 is a partial cutaway side view of wafer 101 after an oxide layer 701 is formed on conductive structure 603. In one embodiment, layer 701 is formed by an oxidation process, but may be formed by a deposition process in other embodiments. In the embodiment shown, ploy structure 603 is recessed (with an etching) to lower the top level of structure 603 before forming layer 701.

Figure 8:
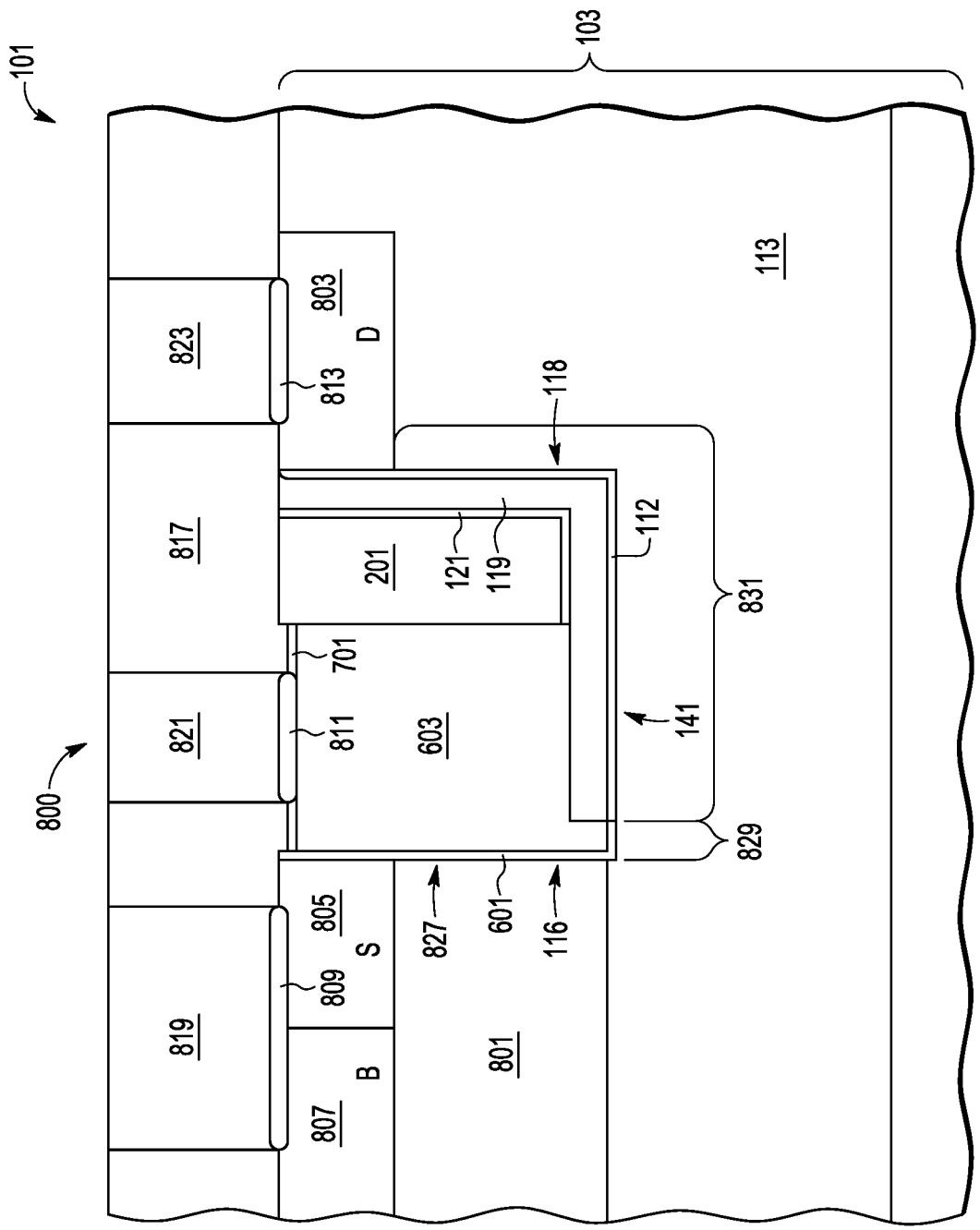

FIG. 8 is a partial cutaway side view of wafer 101 after the formation of other structures for transistor 800. After the stage in FIG. 7, a P-well region 801 is formed in an upper portion of region 113 in substrate 103. In one embodiment, P-well region 801 is formed by selectively implanting P-type dopants into a top portion of substrate 103. In one embodiment, the P-type dopants are boron and are implanted at an energy a 20-200 keV and at a dosage of $1e^{11}$-$1e^{13}/cm^2$, but may include other types of dopants, implanted at other energies, and/or at other doping concentrations in other embodiments. In one embodiment, after the implantation of the P-type dopants, wafer 101 is annealed where the dopants diffuse to the location of P-well region 801 as shown in FIG. 1.

N-type dopants are selectively implanted into substrate 103 through in an implant mask (not shown) to form source region 805 and drain region 803. In one embodiment, phosphorous ions are implanted into substrate 103 at a dosage of $1.5e^{15}$ $cm^{-2}$ and an energy of 50 key, but other types of dopants may be implanted at other dosages and/or at other energies in other embodiments.

In the embodiment shown, P-type dopants are implanted through another implant mask (not shown) into substrate 103 to form body contact region 807. In one embodiment, region 807 is formed by selectively implanting through a mask, boron ions at a dose of $1.5e^{15}$ $cm^{-2}$ and at an energy of at 20 keV into substrate 103. Implantation is followed by an annealing step, e.g. rapid thermal annealing (RTA). Other P-type dopants may be implanted at other doses and/or at other energies in other embodiments.

In the embodiment shown, body contact region 807 is formed immediately adjacent to source region 805. However, in other embodiments, the body contact regions and source regions may be laterally separated.

Contacts 819, 821 and 823 are formed to be electrically coupled to the structures of transistor 800. Prior to the formation of the contacts, a layer 817 of dielectric material is formed over wafer 101. In one embodiment, layer 817 is an oxide layer form by a TEOS process. Openings are then formed in layer 817. Afterwards, exposed silicon in the openings is silicided to form silicide structures 809, 811, and 813. In one embodiment, the silicide structures are formed by depositing a metal (e.g. tungsten) over wafer 101, heating the wafer, and then removing the unreacted metal. Other embodiments may not include the silicide structures.

After the formation of the silicide structures, conductive contacts are formed in the openings to electrically contact the silicide structures. In one embodiment, the contacts are formed of a metal (e.g. tungsten, titanium). Contact 819 electrically contacts silicide structure 809 which contacts body contact region 807 and source region 805. Contact 821 electrically contacts silicide structure 811 which contacts conductive structure 603. Contact 823 electrically contacts silicide structure 813 which contacts drain region 803.

As shown in FIG. 8, transistor 800 includes a source region 805, a drain region 803, a gate (structure 603), and a channel region 827 located in well region 801 along sidewall 116 between source region 805 and region 113. Transistor 800 also includes an extended drain region that extends from P well region 801, under trench 115, along sidewall 118, to drain region 803. The drain extension region includes an accumulation region 829 and a drift region 831.

Conductive structure 603 also serves as a field plate for transistor 800. In the embodiment shown, when a voltage is applied to conductive structure 603, the field plate portion more evenly distributes the voltage drop in the drift region 831 from the drain region 803 to the accumulation region 829.

As shown in FIG. 8, the portion gate structure 603 directly above the accumulation region (829) has a dielectric vertical separation form lower surface level 141 equal to the thickness of layer 601. The lateral separation between structure 603 and channel region 827 is also the thickness of layer 601. The portion of gate structure 603 directly above the drift region 831 has a vertical separation of the thickness of layers 119 and 117. Accordingly, one advantage of structure 603 is that it can be used for both the gate (control terminal) and field plate for a transistor and yet its spacing between the channel region 827 and drift region 831 can be individually adjusted to achieve desired transistor characteristics.

Also with the transistor of FIG. 8, conductive structure 603 is laterally separated from sidewall 118 by a greater distance than conductive structure 603 is laterally separated from sidewall 116. Such a feature may provide a transistor with a higher breakdown voltage by providing a greater amount of dielectric for a voltage drop from a higher drain region voltage (e.g. 20-120 Volts) to a lower gate voltage in an off-state mode (gate at 0 Volts). See the discussion of FIG. 9 below.

Figure 9:
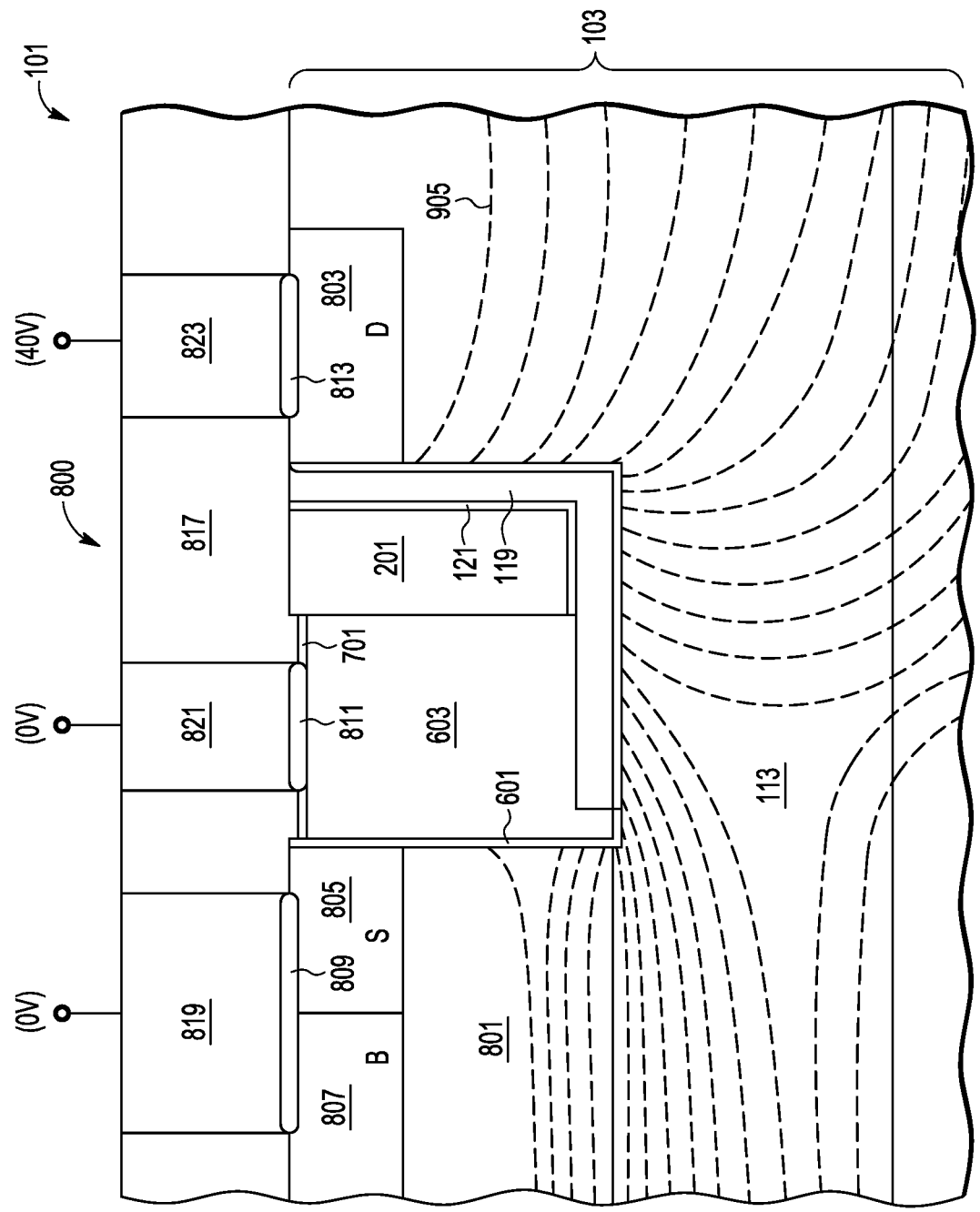
FIG. 9 is a partial side view illustration showing potential fields and the electrical coupling of a transistor device during an operating condition according to one embodiment of the present invention.

After the stage shown in FIG. 9, other processes may be performed on wafer 101 such as forming additional interconnect layers. Afterwards, external terminals e.g. bond pads are formed on wafer 101. Wafer 101 is then singulated into multiple die where each die includes a transistor similar to transistor 800. Afterwards, the die are packaged in semiconductor packaging material to form integrated circuit packages where they are shipped to end use manufacturers to include in end use products such as automobiles, battery control systems, and industrial equipment. In other embodiments, a transistor device may include other structures and/or may be formed by other processes. Furthermore, additional process steps may be added to form other components on the same die.

FIG. 9 shows a partial cross-sectional side view of transistor 800 during an off-state mode of operation according to one embodiment. In the embodiment shown, conductive structure 603, source region 805, and body contact region 807 are each grounded (0 V). 40 Volts is applied to drain region 803.

FIG. 9 shows the equipotential lines 905 representing the electrostatic fields of transistor 800 that occur in substrate 103. As can be shown in FIG. 10, the electrostatic potential between the higher drain voltage (40 V) and the lower source voltage (ground) is distributed in the drain extension region that extends from the drain region 803 to the P well region 801. In one embodiment, the amount of voltage sustained by transistor 800 is dependent upon the width of trench 115, the depth of trench 115, the field oxide layer (117, 119) thicknesses, the depth and doping concentration of the P well region 801 and drain extension region 113, and the depth of drain region 803 with respect to the depth of trench 115. In one embodiment, the breakdown voltage of transistor 800 is in the range of 10V to 150V, but may be of other voltages in other embodiments. Not shown are the equipotential lines in dielectric structure 201.

Having the channel region 827 and a portion of the drift region 831 be vertical allows for a reduction in area of the die over a planar transistor. Having a portion of the drift region 831 be horizontal allows for a transistor to be easily scalable for adjusting the breakdown voltage by increasing or decreasing the width of trench 115. In some embodiments, the length of channel region 827 can be adjusted by varying the depth of the P-well region 801 and/or the source region 805.

Figure 10:
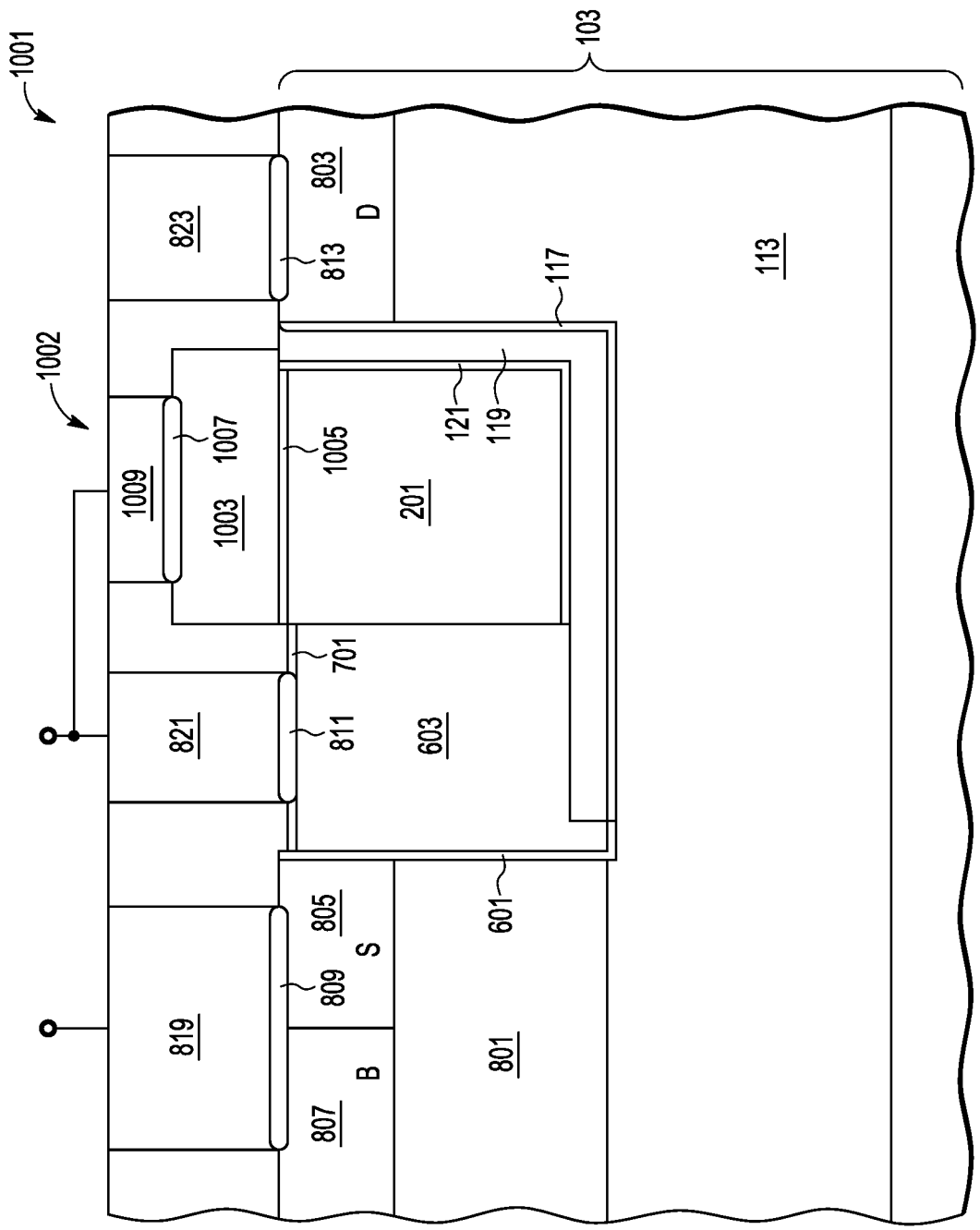
FIG. 10 sets forth a partial cutaway side view of a stage in the manufacture of a transistor device according to another embodiment of the present invention.

FIG. 10 shows a partial cutaway side view of wafer 1000 that includes a transistor 1001 according to another embodiment of the present invention. In the embodiment shown, wafer 1000 is similar to wafer 101, with the structures in FIG. 10 being similar to the structures in FIG. 8 that have the same identification numbers.

In the embodiment of FIG. 10, transistor 1001 includes an additional field conductive plate structure 1003 that is formed over dielectric structure 201. In one embodiment, structure 1003 is lithographically defined where a layer of conductive material (not shown) is etched as per a lithographically defined mask. In one embodiment, structure 1003 is formed from a layer of polysilicon that is used to form gate structures of planar transistor (not shown) at other locations of wafer 1000. Structure 1003 electrically coupled to contact 1009 which is electrically coupled to contact 821 to be biased at the same voltage during operation.

In some embodiments, providing an additional field plate structure (1003) allows for a transistor to handle higher voltage differentials and thereby increase the breakdown voltage of the transistor. In some embodiments the additional field plate structure (1003) can be connected to the source contact (819), which may help in some embodiments, in lowering the capacitive coupling ($C_{gd}$) between gate and drain. Such a configuration may be beneficial in improving the Switching Time (Turn-On/Turn-Off Time).

Figure 11:
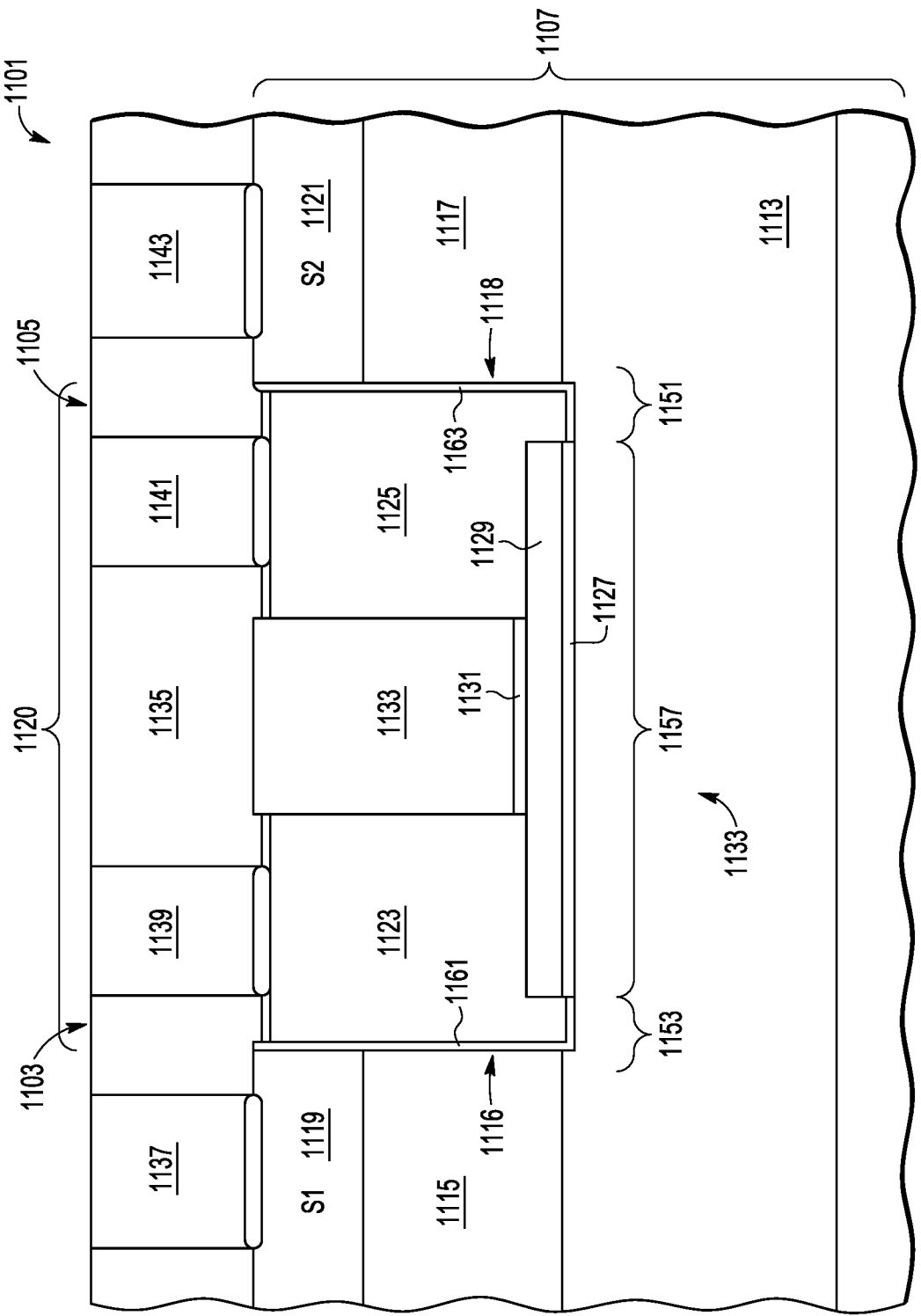
FIG. 11 sets forth a partial cutaway side view of a stage in the manufacture of a transistor device according to another embodiment of the present invention.

FIG. 11 shows a partial cutaway side view of wafer 1101 that includes a transistor device according to another embodiment of the present invention. Wafer 1101 includes transistors 1103 and 1105 which include structures implemented in a semiconductor substrate 1107. Transistor 1103 includes an N-type source region 1119, a channel region 1116 located in P well region 1115, and a conductive structure 1123 that serves as a gate and field plate for transistor 1103. Transistor 1105 includes an N-type source region 1121, a channel region 1118 located in P well region 1117, and a conductive structure 1125 that serves as a gate and field plate for transistor 1105. Gate contact 1139 is electrically coupled to gate structure 1123 and gate contact 1141 is electrically coupled to gate structure 1125. Dielectric structure 1133 and nitride layer 1131 separate conductive structures 1123 and 1125. Transistor 1103 includes a gate dielectric layer 1611 and transistor 1105 includes a gate dielectric layer 1163. In the embodiment shown, the body contact regions (not shown) are not located immediately adjacent to the source regions 1119 and 1121, however, they may be located immediately adjacent to the source regions in other in other embodiments.

In one embodiment, conductive structures 1123 and 1125 are formed with similar processes to the formation of conductive structure 603, except that both sides of trench 1120 in the semiconductor substrate 1107 are exposed for etching the portions of oxide layers 1129 and 1127 located along the vertical sidewalls of trench 1120, as opposed to only the left sidewall 116 of trench 115 being exposed for etching, relative to the view shown in FIG. 4. Nitride layer 1131 protects oxide layers 1129 and 1127 during the etching to remove the portions of those layers from the vertical sidewalls of trench 1120 and from directly over the accumulation regions 1153 and 1151.

The device shown in FIG. 11 is a back-to-back bidirectional transistor device that includes transistors 1103 and 1105 coupled in a back-to-back configuration. The bidirectional transistor device can be implemented as a bidirectional switch. A bidirectional transistor device is a device that can selectively block voltages in both directions and conduct current in both directions. The drain region for both transistors 1302 and 1303 is characterized as a "virtual drain" in that it is not biased at a particular voltage with a direct external contact and it is an internal node of a bi-directional device. In the embodiment shown, a virtual extended drain region located in N type region 1113 extends from P well region 1115 to P well region 1117. The virtual extended drain region includes an accumulation region 1153 for transistor 1103, an accumulation region 1151 for transistor 1105, and a shared virtual drift region 1157.

In one embodiment, a circuit of transistors 1103 and 1105 can be utilized as a switch between a node connected to source contact 1137 and a node connected to the source contact 1143, regardless of which node is at the higher voltage.

Figure 12:
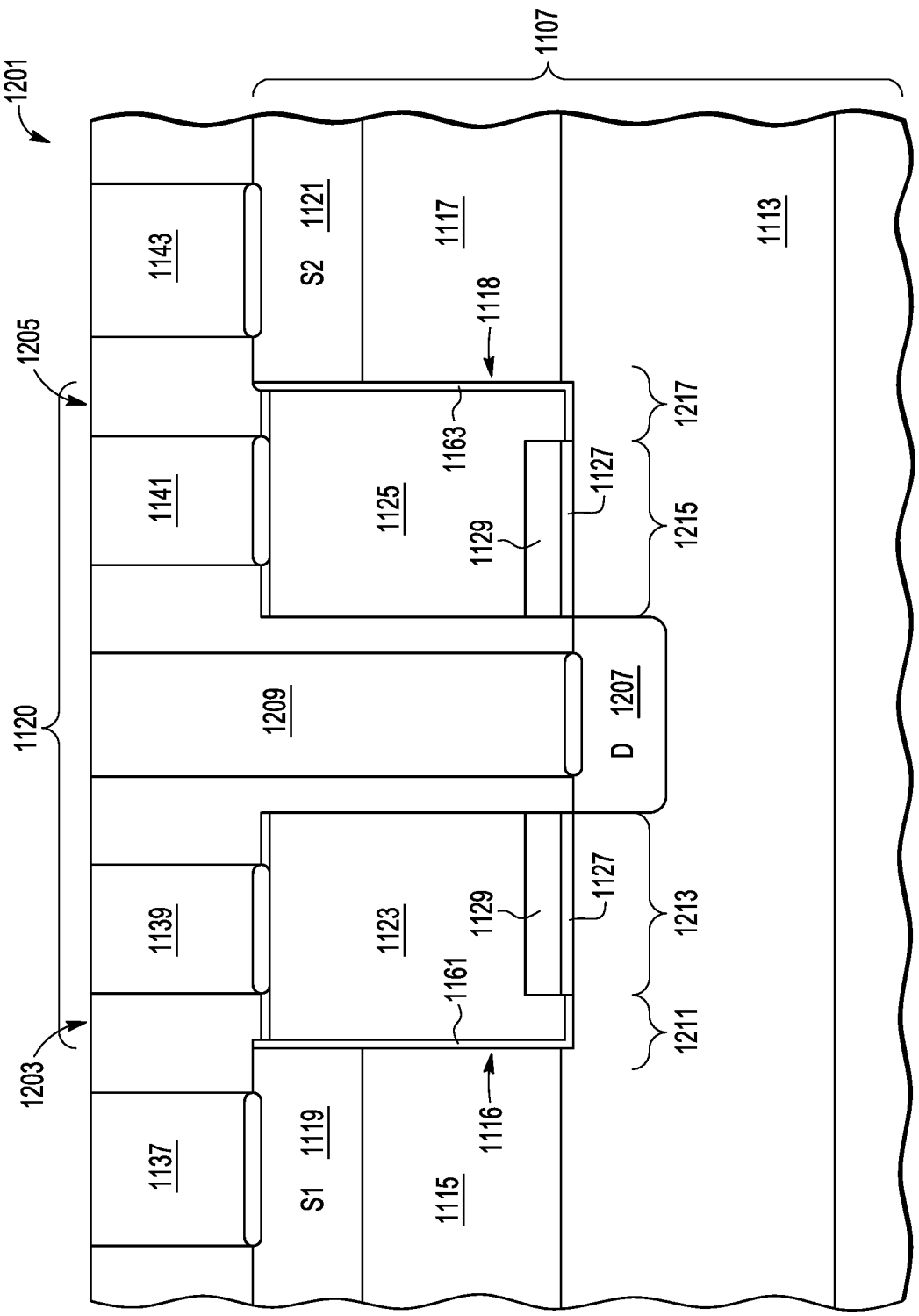
FIG. 12 sets forth a partial cutaway side view of a stage in the manufacture of a transistor device according to another embodiment of the present invention.

FIG. 12 shows a partial cutaway side view of wafer 1201 that includes a transistor device according to another embodiment of the present invention. In the embodiment shown, wafer 1201 is similar to wafer 1101, with the structures in FIG. 12 being similar to the structures in FIG. 11 that have the same identification numbers.

In the view of FIG. 12, wafer 1201 includes two transistors 1203 and 1205. Transistor 1203 includes a source region 1119, a channel region 1116, a conductive structure 1123 which serves as a gate and field plate, and an extended drain region that includes accumulation region 1211 and drift region 1213. Transistor 1205 includes a source region 1121, a channel region 1118, a conductive structure 1125 which serves as a gate and field plate, and an extended drain region that includes accumulation region 1217 and drift region 1215.

Transistors 1203 and 1205 are different from transistors 1103 and 1105 in that transistors 1203 and 1205 have a shared drain region 1207 that is biased through drain contact 1209. In one embodiment, the dielectric structure (e.g. similar to dielectric structure 1133) located between the conductive structures 1123 and 1125 and the underlying nitride layer 1131 are removed along with the directly underlying portions of layers 1129 and 1127 to expose substrate 1107. Afterwards, N type dopants are implanted into substrate 1107 to form drain region 1207. Dielectric material 1135 is then deposited over wafer 1201 wherein contact openings is formed in material 1135 for the contacts including for drain contact 1209. However, transistors 1203 and 1205 may be formed by other methods in other embodiments.

In other embodiments, the transistors may have other configurations, other structures, be of other transistor types, and/or be formed by other methods.

As disclosed herein, a first structure is "directly over" a second structure if the first structure is located over the second structure in a line having a direction that is perpendicular with the generally planar major side of a wafer. For example, in FIG. 8, source region 805 is directly over region 113. Contact 821 is not directly over drain region 803. As disclosed herein, a first structure is "directly beneath" a second structure if the first structure is located beneath the second structure in a line having a direction that is perpendicular with the generally planar major side of the wafer. For example, in FIG. 8, P-well region 801 is directly beneath contact 819. P well region 801 is not directly beneath contact 823. One structure is "directly between" two other structures in a line if the two structures are located on opposite sides of the one structure in the line. For example, in FIG. 8, structure 603 is located directly between region 801 and structure 201 in a line in the cut away side view of FIG. 8. Contact 821 is not located directly between region 803 and region 801 in a line. A "lateral line" is a line that is parallel with a generally planar major side of the wafer. In FIG. 8, structures 603 and 201 are located in a lateral line. Region 801 and contact 823 are not located in a lateral line. As disclosed herein, a first structure is "laterally separated" from a second structure if there is separation between the two structures in a line that is parallel with a generally planar major side of the wafer. For example, in FIG. 8, structure 603 and region 801 are laterally separated from each other. As disclosed herein, a "lateral distance" is the distance in a direction that is parallel with a generally planar major side of the wafer. As disclosed herein, a "vertical distance" is the distance in a direction that is perpendicular with a generally planar major side of the wafer. A "vertical component sidewall" of a trench is a portion of a trench sidewall having a profile that overall, the majority component of the portion is vertical even though it may also have a horizontal component or that it may have minor horizontal discontinuity at an interior location of the sidewall portion. For example, a portion of a sidewall sloped at 70 degrees may be considered a vertical component sidewall portion. A sidewall spacer structure is a structure defined by its self-aligned spacing from a sidewall and is not photo lithographically defined.

Features shown or described herein with respect to one embodiment may be implemented in other embodiments shown or described herein. For example, in FIGS. 11 and 12, source regions 1119 and 1121 may be each located laterally adjacent to a body contact region (e.g. similar to region 807).

In one embodiment, a method for forming a transistor device includes forming a trench in a semiconductor material. The trench including a first vertical component sidewall, a second vertical component sidewall, and a bottom portion. The method includes forming a layer of a first dielectric material in the trench including along the first vertical component sidewall, the second vertical component sidewall, and the bottom portion. The method includes forming a layer of a second dielectric material over the layer of the first dielectric material. The second dielectric material is different from the first dielectric material. The method includes after the forming the layer of the second dielectric material, removing a portion of the layer of the first dielectric material along the first vertical component sidewall of the trench and along a first portion of the bottom portion of the trench. The first portion of the bottom portion is closer to the first vertical component sidewall than the second vertical component sidewall. As a result of the removing, a portion of the layer of the first dielectric material remains along a second portion of the bottom portion, the second portion is closer to the second vertical component sidewall than the first vertical component sidewall. The method includes forming a control terminal structure for a transistor including a portion located in the trench. The control terminal structure including a first vertical component side and a second vertical component side opposite the first vertical component side. The first vertical component side is located closer to the first vertical component sidewall than the second vertical component sidewall. The first vertical component side is located in a volume of the trench that the portion of the layer of the first dielectric material was removed from along the first vertical component sidewall and along the first portion of the bottom portion. The second vertical component side of the control terminal structure is located directly over the second portion of the bottom portion. The control terminal structure is located directly over an extended drain region for the transistor.

In another embodiment, a transistor device includes semiconductor material including an upper level portion and a lower level portion separated by a vertical component sidewall. The transistor device includes a channel region including a portion located in the vertical component sidewall and a first layer of dielectric material located along the vertical component sidewall and along a first portion of the lower level portion. The transistor device includes a second layer of dielectric material located directly over a second portion of the lower level portion but not located directly over the first portion of the lower level portion. The first portion is located laterally closer to the vertical component sidewall than the second portion. The transistor device includes a third layer of dielectric material located over directly over a portion of the second layer of dielectric material and directly over a third portion of the lower level portion. The second portion of the lower level portion is located laterally between the first portion and the third portion of the lower level portion. The third layer of dielectric material is etch selectable from the second layer of dielectric material. The transistor device includes a conductive structure laterally adjacent to the vertical component sidewall and located directly over the first portion and the second portion. The conductive structure serves as a control terminal and field plate for a transistor. The conductive structure includes a bottom surface having a first portion that is vertically separated by dielectric from the first portion of the lower level portion by a first vertical distance and having a second portion that is vertically separated by dielectric from the second portion of the lower level portion by a second vertical distance. The second vertical distance is greater than the first vertical distance.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a transistor device comprising:
   forming a trench in a semiconductor material, the trench including a first vertical component sidewall, a second vertical component sidewall, and a bottom portion;
   forming a layer of a first dielectric material in the trench including along the first vertical component sidewall, the second vertical component sidewall, and the bottom portion;
   forming a layer of a second dielectric material over the layer of the first dielectric material, the second dielectric material being different from the first dielectric material;
   after the forming the layer of the second dielectric material, removing a portion of the layer of the first dielectric material along the first vertical component sidewall of the trench and along a first portion of the bottom portion of the trench, wherein the first portion of the bottom portion is closer to the first vertical component sidewall than the second vertical component sidewall, wherein as a result of the removing, a portion of the layer of the first dielectric material remains along a second portion of the bottom portion, the second portion is closer to the second vertical component sidewall than the first vertical component sidewall;
   forming a control terminal structure for a transistor including a portion located in the trench, the control terminal structure including a first vertical component side and a second vertical component side opposite the first vertical component side, the first vertical component side is located closer to the first vertical component sidewall than the second vertical component sidewall, wherein the first vertical component side is located in a volume of the trench that the portion of the layer of the first dielectric material was removed from along the first vertical component sidewall and along the first portion of the bottom portion, wherein the second vertical component side of the control terminal structure is located directly over the second portion of the bottom portion;
   wherein the control terminal structure is located directly over an extended drain region for the transistor.

2. The method of claim 1 further comprising:
   forming a source region for the transistor in the semiconductor material;
   forming a channel region for the transistor in the semiconductor material.

3. The method of claim 2 wherein the channel region includes a portion located along the first vertical component sidewall.

4. The method of claim 3 wherein the source region includes a portion located above the channel region.

5. The method of claim 2 further comprising:
   forming a drain region for the transistor in the semiconductor material;
   wherein the drain region includes a portion located along the second vertical component sidewall.

6. The method of claim 2 further comprising:
   forming a drain region for the transistor in the semiconductor material;
   wherein the drain region includes a portion located directly below the bottom portion.

7. The method of claim 1 wherein the removing includes etching the layer of first dielectric material, wherein the layer of the second dielectric material protects the layer of first dielectric material located directly over the second portion from being etched during the etching.

8. The method of claim 1 wherein the second vertical component side of the control terminal structure is located directly over a drift region of the extended drain region in the semiconductor material, wherein the first vertical component side of the control terminal structure is located directly over an accumulation region of the extended drain region in the semiconductor material.

9. The method of claim 1 wherein the first dielectric material is characterized as an oxide and the second dielectric material is characterized as a nitride.

10. The method of claim 1 wherein the first vertical component side is vertically closer to the bottom portion than the second vertical component side.

11. The method of claim 1 wherein:
   the removing further includes removing a portion of the layer of the first dielectric material along the second vertical component sidewall of the trench and along a third portion of the bottom portion of the trench, wherein the third portion of the bottom portion is closer to the second vertical component sidewall than the first vertical component sidewall, wherein as a result of the removing, the second portion is closer to the first vertical component sidewall than the second vertical component sidewall;

the method further comprises forming a second control terminal structure for a second transistor including a portion located in the trench, the second control terminal structure including a first vertical component side and a second vertical component side opposite the first vertical component side, the first vertical component side of the second control terminal structure is located closer to the second vertical component sidewall than the first vertical component side of the second control terminal structure, wherein the first vertical component side of the second control terminal structure is located in a volume of the trench that the portion of the layer of the first dielectric material was removed from along the second vertical component sidewall and along the third portion of the bottom portion, wherein the second vertical component side of the control terminal structure is located directly over the second portion of the bottom portion;

the second control terminal structure is located directly over an extended drain region for the second transistor.

12. The method of claim 11 wherein the transistor and the second transistor are configured in a back-to-back configuration, wherein the transistor and the second transistor include a shared virtual drain directly below the second portion of the trench.

13. The method of claim 11 comprising forming a shared drain region for the transistor and the second transistor in the semiconductor material directly below the second portion.

14. The method of claim 11 wherein the control terminal structure serves as a field plate for the transistor and the second control terminal structure serves as a field plate for the second transistor.

15. The method of claim 1 further comprising:

forming a mask over the semiconductor material, the mask including an opening over an area that includes at least a portion of the first vertical component sidewall;

wherein the removing includes removing includes removing the portion of the layer of the first dielectric material along the first vertical component sidewall of the trench and along a first portion of the bottom portion of the trench by etching through the opening, wherein a portion of the second portion is located in the area of the opening of the mask, wherein the layer of the second dielectric material directly over the portion of the second portion protects the layer of first dielectric material located directly over the portion of the second portion from being etched during the removing.

16. The method of claim 1 wherein the control terminal structure serves as a field plate structure for the transistor.

17. The method of claim 16 further comprising forming a lithographically defined field plate structure directly over the bottom portion, the field plate structure serves as a second field plate for the transistor.

* * * * *